(12) United States Patent
Lo et al.

(10) Patent No.: US 6,190,928 B1
(45) Date of Patent: Feb. 20, 2001

(54) METHOD FOR ACTUALLY MEASURING MISALIGNMENT OF VIA

(75) Inventors: Yung-Tsun Lo; Kam-Tung Li; Kuan-Chieh Huang, all of Hsin-Chu (TW)

(73) Assignee: Mosel Vitelic Incorporated, Hsin-Chu (TW)

(*) Notice: Under 35 U.S.C. 154(b), the term of this patent shall be extended for 0 days.

(21) Appl. No.: 09/145,983

(22) Filed: Sep. 3, 1998

(30) Foreign Application Priority Data

Aug. 14, 1998 (TW) .................................................. 87113386

(51) Int. Cl.[7] .................................................... G01R 31/26
(52) U.S. Cl. .......................... 438/14; 438/637; 438/640; 438/675
(58) Field of Search .............................. 438/14, 637, 636, 438/639, 640, 668, 672, 675

(56) References Cited

U.S. PATENT DOCUMENTS

| | | | |
|---|---|---|---|
| 3,844,831 | * 10/1974 | Cass | ....................... 117/212 |
| 4,035,276 | * 7/1977 | Havas | ..................... 204/192 |
| 4,184,909 | * 1/1980 | Chang et al. | ............... 438/637 |
| 5,958,794 | * 9/1999 | Bruxvoort | ............... 438/692 |
| 5,959,459 | * 9/1999 | Satya | ..................... 324/751 |
| 6,051,866 | * 4/2000 | Shaw | ..................... 257/417 |
| 6,078,738 | * 6/2000 | Garza | ............... 395/500.22 |
| 6,081,659 | * 6/2000 | Garza | ............... 395/500.22 |

* cited by examiner

Primary Examiner—John F. Niebling
Assistant Examiner—André Stevenson
(74) Attorney, Agent, or Firm—Bacon & Thomas

(57) ABSTRACT

The present invention relates to a method for actually measuring misalignment of a via. According to the invention, a via is formed by etching an inter metal dielectric (IMD) layer using a photoresist with a via pattern as a mask so that via pattern can be accurately transferred to the inter metal dielectric layer. Then a patterned metal interconnection line underlying the inter metal dielectric layer is etched using the patterned inter metal dielectric layer as a mask and followed by a process of stripping the inter metal dielectric layer. After that, an actual misalignment can be detected by measuring relative distance between the patterned metal interconnection line and the via thereon through Scanning Electron Microscopy (SEM), by which overlay specifications for OSI instrument can be verified and adjusted.

8 Claims, 3 Drawing Sheets

METHOD FOR ACTUALLY MEASURING MISALIGNMENT OF VIA

DESCRIPTION OF THE PRIOR ART

Rapidly developed progress has recently been made which allows more electronic elements such as field effect transistors to be integrated on a single chip. Consequently the metal interconnection pattern by which electronic elements are connected is more complicated. In order to meet a need of high operating speed without increasing occupied chip area of metal interconnection lines, a multi-level metallization structure, which comprises several levels of metal interconnection lines, an inter metal dielectric (IMD) layer therebetween used for isolation, and vias by which different levels can be connected, is generally employed. However, an alignment between vias and its underlying metal interconnection lines is a crucial factor for product yield and reliability. Therefore, in a practical production line, overlay specifications are made to ensure that the measured misalignment of vias, through a measuring instrument such as an OSI (overlay specification inspection) instrument, is tolerated or not. If the measured misalignment exceeds the overlay specifications, the chips should be reworked; otherwise it will result in higher contact resistivity of vias, slower operating speed, and excessively opened metal interconnection lines. Thus, an exposure process is most important in photolithography processes of vias.

Since alignment during exposure is important, an overlay mark located on a scribing line of a chip is designed to monitor alignment inside cells and is left on every layer by which an integrated circuit (IC) is constituted after finishing the sequential processes of exposure, developing and etching. A worker aligns the overlay mark of a mask to that of the proceeding layer of the chip through a microscope; however the actual misalignment inside cells is still unknown, as well as how much misalignment tolerance inside cells. In order to get more accurately aligned, the overlay specifications will be tighter so as to guarantee accurate alignment inside cells. Additionally many wafers won't proceed until a pilot run wafer is tested and its measured misalignment meets the overlay specifications in a practical production line. However, the overlay specifications are made so tight as to raise the rework rate of the pilot wafer which in turn increases idle time of an exposure tool such as a stepper, thus decreasing the throughput of production line. These problems become more serious especially in an exposure of a via so that we should find out how much process margin there is for the actual alignment inside cells in order to suitably loose the overlay specifications. Hence, it is a key issue for manufacturers to find out a method for actually measuring misalignment of via by which the throughput can be increased.

SUMMARY OF INVENTION

It is the objective of this invention to provide a method for actually measuring misalignment of via which allows for increasing the throughput of the production line.

It is another objective of this invention to provide a method for actually measuring misalignment of via which allows for decreasing rework rate of the pilot wafer and idle time of exposure tool such as a stepper.

According to the invention, a via is formed by etching an inter metal dielectric (IMD) layer using a photoresist with a via pattern as a mask so that the via pattern can be accurately transferred to the inter metal dielectric layer. Then a patterned metal interconnection line underlying the inter metal dielectric layer is etched using the patterned inter metal dielectric layer as a mask and followed by a process of striping the inter metal dielectric layer. After that, an actual misalignment can be made by measuring relative distance between the patterned metal interconnection line and the via thereon through Scanning Electron Microscopy (SEM), by which overlay specifications for OSI instrument can be verified and adjusted.

DESCRIPTION OF THE FIRST PREFERRED EMBODIMENT

Figure 1:
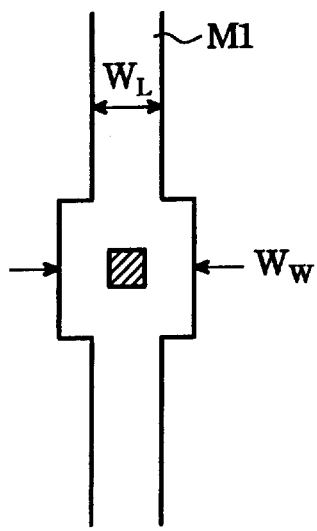
FIG. 1 is a top view of multi-level metallization structure according to the present invention.
Figure 2A:
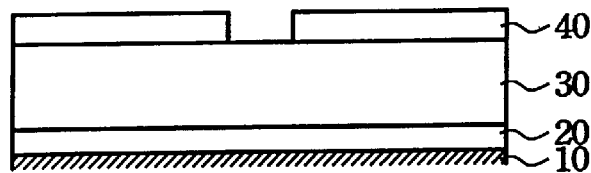
FIGS. 2A–2E are cross sectional views of key steps for finishing the multi-level metallization structure taken along Ww direction of FIG. 1, according to the first preferred embodiment.
Figure 2B:
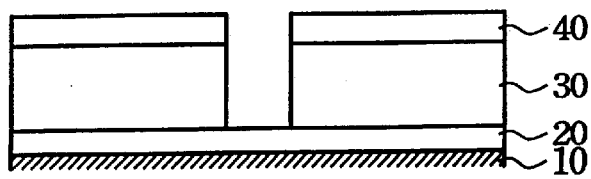
Figure 2C:
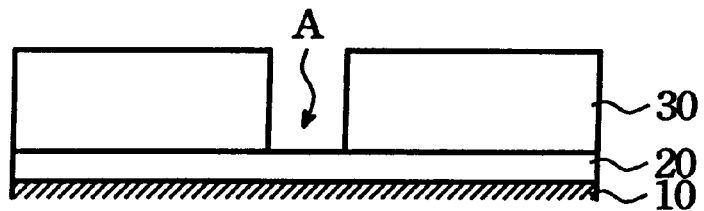

As mentioned above, since vias are used for connection between different levels of metal interconnection lines, alignment between vias and proceeding metal interconnection lines is a key factor which affects product function such as operating speed etc. FIG. 1 is a top view of multi-level metallization structure wherein the declined area denotes a via area, and M1 denotes underlying metal interconnection lines with linewidth WL in which there is a square area having width Ww larger than WL used for easy alignment. FIGS. 2A–2E are cross sectional views of key steps for finishing the multi-level metallization structure taken along Ww direction of FIG. 1. FIGS. 2A–2E are described as follows. FIGS. 2A–2C are traditional processes for forming vias on an inter metal dielectric layer. First of all, after finishing field effect transistors (not shown in Figure) on a silicon substrate 10, a metal layer is deposited and patterned to be a metal interconnection line 20 through photolithography processes and then etching the metal layer. Subsequently, an inter metal dielectric layer 30 such as $SiO_2$ is deposited to be used for an isolation between neighboring levels of metal interconnection lines 20. Thereafter, a photoresist layer is coated and then patterned to be a patterned photoresist 40 with via pattern therein through a photolithographic process with a via mask, as shown in FIG. 2A.

Figure 2D:
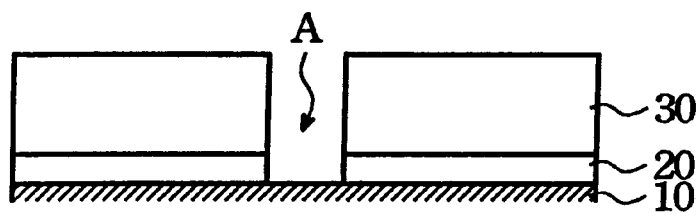
Figure 2E:
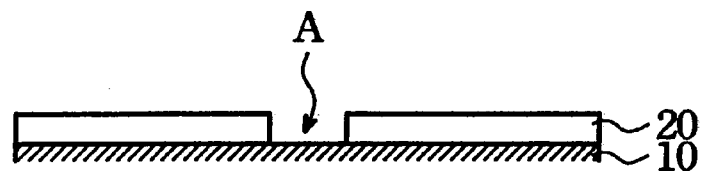

The inter metal dielectric layer 30 is etched by a reactive ion etching method to form a plurality of vias A, as shown in FIG. 2B. Thereafter, the patterned photoresist 40 is removed by a chemical solution, as shown in FIG. 2C. In order to simulate the relative location between the via A and the metal interconnection line 20, the metal interconnection line 20 is etched using the patterned inter metal dielectric layer 30 as a mask so that the vias pattern can be accurately transferred to the metal interconnection line 20, as shown in FIG. 2D. Preferably anisotropic etching such as Reactive Ion Etching is used so that the shape of via can be faithfully transferred to the metal interconnection line 20 and no distortion occurs. Finally, a sample for actual measuring misalignment of via is finished after removing the patterned inter metal dielectric layer 30, as shown in FIG. 2E.

DESCRIPTION OF THE SECOND PREFERRED EMBODIMENT

Figure 2F:
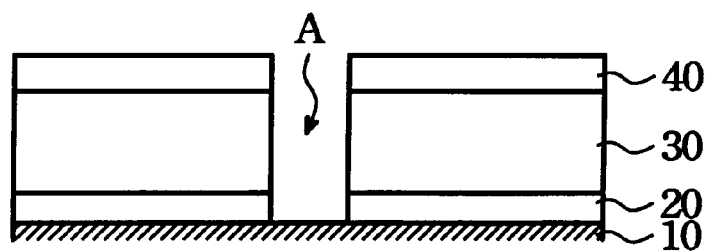
FIGS. 2F–2H are cross sectional views of key steps for finishing the multi-level metallization structure taken along Ww direction of FIG. 1, according to the second preferred embodiment.
Figure 2G:
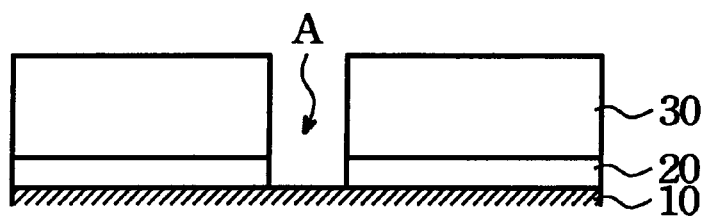
Figure 2H:
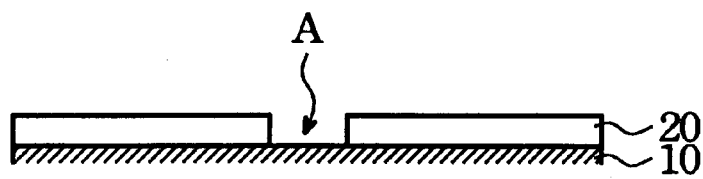

After finishing a process of etching the inter metal dielectric layer 30, as shown in FIG. 2B, stripping the patterned photoresist 40 is followed as disclosed in the first preferred embodiment. However there is an alternative process which reserves the patterned photoresist 40 as described below. The metal interconnection line 20 is etched using the patterned photoresist 40 as a mask, as shown in FIG. 2F and then the patterned photoresist 40 is stripped as shown in FIG. 2G. Finally, the via pattern can be accurately transferred to the metal interconnection line 20 used as a sample for measuring misalignment of a via after stripping the patterned inter metal dielectric layer 30, as shown in FIG. 2H.

The actual misalignment of via can be made by observing a top view (as shown in FIG. 1) of a sample prepared by the first or the second preferred embodiment under Scanning Electron Microscopy (SEM). The actual misalignment is measured by the relative distance between the via A and the metal interconnection line 20 through SEM rather than measuring the relative distance of their overlay marks by observing cross-sectional view of overlay mark through SEM, in which a sample with a cross section of overlay marks is hard to prepare, thus making this measuring method impracticable. The present invention not only allows for easier measurement of via than that of overlay mark, but for actual measurement of via not just simulation of overlay mark. The latter measured data can be used as a reference to adjust or loose the overlay specifications obtained from a measuring instrument such as OSI, thereby decreasing the rework rate of a pilot wafer and idle time of an exposure tool such as a stepper and furthermore increasing throughput of production line. Furthermore, the measured data according to the present invention can monitor the difference between different measuring instruments such as OSI by which each corresponding overlay specifications can be suitably adjusted.

By comparing the present invention and the prior art, a significant advantage can be obviously seen; i.e. the overlays specifications can be adjusted or loosed by using a method for actual measuring misalignment of a via through Scanning Electron Microscopy. Thus, rework rate of the pilot wafer and idle time of an exposure tool such as a stepper can be considerably decreased, thereby increasing throughput of production line which is highly beneficial to a manufacturer. While particular embodiments of the present invention has been illustrated and described, it would be obvious to those skilled in the art that various other changes and modifications can be made with departing from the spirit and scope of the invention. It is therefore intended to cover in the appended claims all such changes and modifications that are within the scope of the present invention.

What is claimed is:

1. A method for actually measuring misalignment of via, comprising:

forming field effect transistors on a silicon substrate;
   forming a metal interconnection line after depositing a metal layer and then patterning through a photolithography process and etching the metal layer; forming an inter metal dielectric layer on said metal interconnection line;

coating a photoresist and then patterning said photoresist to form a patterned photoresist layer through a photolithography process with a via mask; forming a plurality of vias after etching the inter metal dielectric layer using the patterned photoresist layer as a mask; stripping the patterned photoresist layer and then etching the metal interconnection line using the inter metal dielectric layer as a mask;

stripping the inter metal dielectric layer so as to transfer via pattern to the metal interconnection line; and measuring misalignment of via by measuring the relative distance between the via and the metal interconnection line through SEM.

2. A method for actually measuring misalignment of via according to claim 1, wherein the metal interconnection line has a square area with its width Ww larger than linewidth of the metal interconnection line WL, through which the via can be connected to the metal interconnection line.

3. A method for actually measuring misalignment of via according to claim 1, wherein the material of the inter metal dielectric layer is $SiO_2$.

4. A method for actually measuring misalignment of via according to claim 1, wherein the process of etching the metal interconnection line using the patterned inter metal dielectric layer as a mask is a reactive ion etching process.

5. A method for actually measuring misalignment of via, comprising:

forming field effect transistors on a silicon substrate;
   forming a metal interconnection line after depositing a metal layer and then patterning through a photolithographic process and etching the metal layer; forming an inter metal dielectric layer on said metal interconnection line;

coating a photoresist and then patterning said photoresist to form a patterned photoresist layer through a photolithographic process with a via mask; forming a plurality of vias after etching the inter metal dielectric layer and the metal interconnection line using the patterned photoresist layer as a mask;

stripping the patterned photoresist layer;
   stripping the inter metal dielectric layer so as to transfer via pattern to the metal interconnection line; and measuring misalignment of via by measuring the relative distance between the via and the metal interconnection line through SEM.

6. A method for actually measuring misalignment of via according to claim 5, wherein the metal interconnection line has a square area with its width Ww larger than linewidth of the metal interconnection line WL, through which the via can be connected to the metal interconnection line.

7. A method for actually measuring misalignment of via according to claim 5, wherein the material of the inter metal dielectric layer is $SiO_2$.

8. A method for actually measuring misalignment of via according to claim 5, wherein the process of etching the metal interconnection line using the patterned inter metal dielectric layer as a mask is a reactive ion etching process.

* * * * *